(12) United States Patent
Wakiyama et al.

(10) Patent No.: US 6,184,519 B1
(45) Date of Patent: Feb. 6, 2001

(54) SURFACE ANALYZING APPARATUS WITH ANTI-VIBRATION TABLE

(75) Inventors: Shigeru Wakiyama, Chiba; Naohiko Fujino, Tokyo, both of (JP)

(73) Assignees: Seiko Instruments Inc.; Mitsubishi Denki Kabushiki Kaisha, both of (JP)

( * ) Notice: Under 35 U.S.C. 154(b), the term of this patent shall be extended for 0 days.

(21) Appl. No.: 09/061,800

(22) Filed: Apr. 16, 1998

(30) Foreign Application Priority Data

Apr. 16, 1997 (JP) .................................................. 9-099351

(51) Int. Cl.$^7$ ............................. G12B 21/20; G12B 21/24
(52) U.S. Cl. ............................ 250/234; 250/306; 73/105
(58) Field of Search .................................. 250/234, 306, 250/216, 227.26, 559.19, 559.24, 559.26, 559.49, 307, 309, 310; 73/105; 248/550, 562, 636, 638

(56) References Cited

U.S. PATENT DOCUMENTS

| | | | |
|---|---|---|---|
| 4,531,699 | * 7/1985 | Pinson | 248/550 |
| 4,665,313 | * 5/1987 | Wells | 250/306 |
| 5,011,108 | * 4/1991 | Chen et al. | 248/550 |
| 5,081,353 | * 1/1992 | Yamada et al. | 250/306 |
| 5,631,506 | * 5/1997 | Paden | 310/51 |
| 5,693,938 | * 12/1997 | Marchman et al. | 250/234 |
| 5,876,012 | * 3/1999 | Haga et al. | 248/550 |

* cited by examiner

Primary Examiner—John R. Lee
(74) Attorney, Agent, or Firm—Adams & Wilks

(57) ABSTRACT

A probe microscope carries a so-called active anti-vibration table in which a vibration to a anti-vibration table plate by a floor vibration is detected by a shift meter, an acceleration sensor or the like, and a vibration having an opposite phase to that of this vibration is given to the anti-vibration table plate, thereby reducing an external vibration component from the floor vibration also in the apparatus installation site having frequencies from a low frequency component to a high frequency component.

35 Claims, 2 Drawing Sheets

SURFACE ANALYZING APPARATUS WITH ANTI-VIBRATION TABLE

BACKGROUND OF THE INVENTION

The present invention relates to a scanning probe microscope which may detect a physical quantity with a high resolution, in which an anti-vibration table is added to a scanning probe microscope such as an atomic force microscope or a magnetic microscope for detecting a physical quantity such as an atomic force received from a sample even if the system is provided in a noisy space such as a clean room or the like for semiconductor manufacture.

The atomic force microscope which is a kind of a scanning probe microscope has been researched as a surface shape observation means for a novel insulative substance since it was invented by G. Binnig who was the inventor of an STM (Physical Review Letters vol. 56, p930, 1986). In principle, the atomic force that acts between the sample and a detecting chip whose tip end is sufficiently sharpened is measured as a deviation of a spring element on which the detecting chip is mounted, the surface of the sample is scanned while keeping constant the deviation quantity of the spring element, and the shape of the surface of the sample is measured as shape information as a control signal for keeping constant the deviation quantity of the spring element.

The spring element deviation detecting means is usually divided into an optical system and an STM system using a tunnel current.

The STM system utilizes a so-called tunnel phenomenon in which a current starts to flow when a voltage is applied to two conductors when the latter are caused to be close to each other by a distance of several nano meters to several angstroms. The conductivity is applied to the spring element. The sharp metal needle is located close to the spring element within about one nano meter. The tunnel current is caused to flow therethrough. Its current value is controlled as a shift signal of the spring element.

It is also reported that an optical system such as an example using an interfering method (Journal of Vacuum Science Technology A6(2), p266, March/April 1988) or an example referred to as an optical lever system in which a laser beam is applied to the spring element and a deviation of a reflective light therefrom is detected by an optical detecting element as the shift signal (Journal of Applied Physics 65(1), 1 p164, January 1989) is used.

If the scanning probe microscope is one in which the probe disposed in a position facing the sample is to receive an atomic force from the sample, then it is called an atomic force microscope. If it receives a magnetic force, it is called a magnetic force microscope. Thus, it is referred to as one that may detect a state of the sample by detecting the various forces generated from the sample.

The scanning probe microscope is provided with a very high sensitivity detecting portion such that a difference in shape or the like between atoms may be identified. On the other hand, since the scanning probe microscope is provided with the high sensitivity detecting portion, the probe microscope is also sensitive to vibration or sound from the outside. Namely, if the sample and the detecting portion are changed (vibrated) relative to each other by the vibration or sound from the outside, then the variation component is also detected. Therefore, the variation component by the vibration from the outside is detected by the detecting portion whereby it is mixed with the signal component representative of the sample condition. As a result, the resolution of the scanning probe microscope is degraded. For this reason, in order to avoid the adverse affect of the vibration, in general, the scanning probe microscope is designed to be small in size and high in rigidity.

However, there is another demand for measuring any desired position on an eight inch wafer of the type supplied recently to a semiconductor manufacture system and there is provided a scanning probe microscope (large size stage-type probe microscope) into which a large size stage is installed. However, if the scanning probe microscope becomes large in size, it is rather difficult to avoid the adverse affect of the vibration from the installation site. Incidentally, the large size scanning probe microscope is disclosed in detail in the literature (J. Vac. Sci. Technol. B 12(3), May/June 1994 P1572).

The vibration of the floor on which the scanning probe microscope is provided constitutes the main vibration from the outside. A variety of frequency components are present depending upon the installation circumstances in the floor vibration. There is a vibration having a low frequency component like several Hz (10 Hz or less). In general, in the element part such as the detecting portion or the like of the scanning probe microscope, an anti-vibration table is provided for reducing the adverse affect of the vibration from the floor and the detecting portion is structured on the base of the anti-vibration table. In general, it is known to use pneumatic means as the anti-vibration table. However, since a pneumatic spring mechanism is basically a spring element, it has a resonance point. Usually, the resonance point is low in the range of about 1 to 3 Hz. In such an anti-vibration table having a low resonance point, it is impossible to reduce the vibration component for the vibration having a low frequency such as the vibration component of the floor, typically 4 Hz or less. Inversely, this is amplified on the anti-vibration table. On the other hand, since clean conditions are needed in the semiconductor manufacture system, mass-production has been developed in a so-called clean room. However, since the clean room must have a clean air space, clean air is circulated through the clean room, and also many devices including evaluation devices are provided in the room, and consequently various noises are generated. Also, the building itself which is furnished with the clean room exhibits a vibration component. For this reason, there exists a vibration having a high frequency or a vibration of low frequency vibration on the floor within the clean room.

An object of the present invention is to provide a scanning probe microscope in which a novel vibration base for the probe microscope is provided for forcibly reducing an affect of vibrations in a range from a high frequency to a low frequency not only for high frequency components caused by a sound or the like but also for low frequency components caused by an apparatus installation site such as a clean room or the like which produces a low frequency component with a rather high intensity, thereby eliminating a degradation of the inherent resolution possessed by the probe microscope.

SUMMARY OF THE INVENTION

According to this invention, a scanning probe microscope carries a so-called active anti-vibration table in which the vibration caused by a floor vibration and which is trnasmitted to the anti-vibration table is detected by using a shift meter, an acceleration sensor or the like, and a vibration having an opposite phase to that of this vibration is imparted to an anti-vibration table plate, thereby reducing the vibration from the floor on the anti-vibration table plate, and reducing an external vibration component from the floor vibration also on the apparatus installation site having a low frequency to a high frequency. Also, for removing a high frequency component caused by a sound or the like other than the floor, the overall scanning probe microscope apparatus is covered by a sound reduction cover. One such active anti-vibration table is described in detail in (NIKKEI MICRO-DEVICE November 1993 P105).

In accordance with the invention, it is possible to reduce a resonant frequency which appears in an air spring type or the like, and such an apparatus is provided that, in particular, a low frequency component out of the vibration components from the floor to be mixed into a signal component representative of the sample condition may be reduced, thereby making it possible to enhance the inherent resolution of the scanning probe microscope. Also, the overall scanning probe microscope is covered by a sound reduction cover, thereby removing the high frequency component.

DETAILED DESCRIPTION OF THE INVENTION

One embodiment of the present invention will now be described with reference to the drawings.

Figure 1:
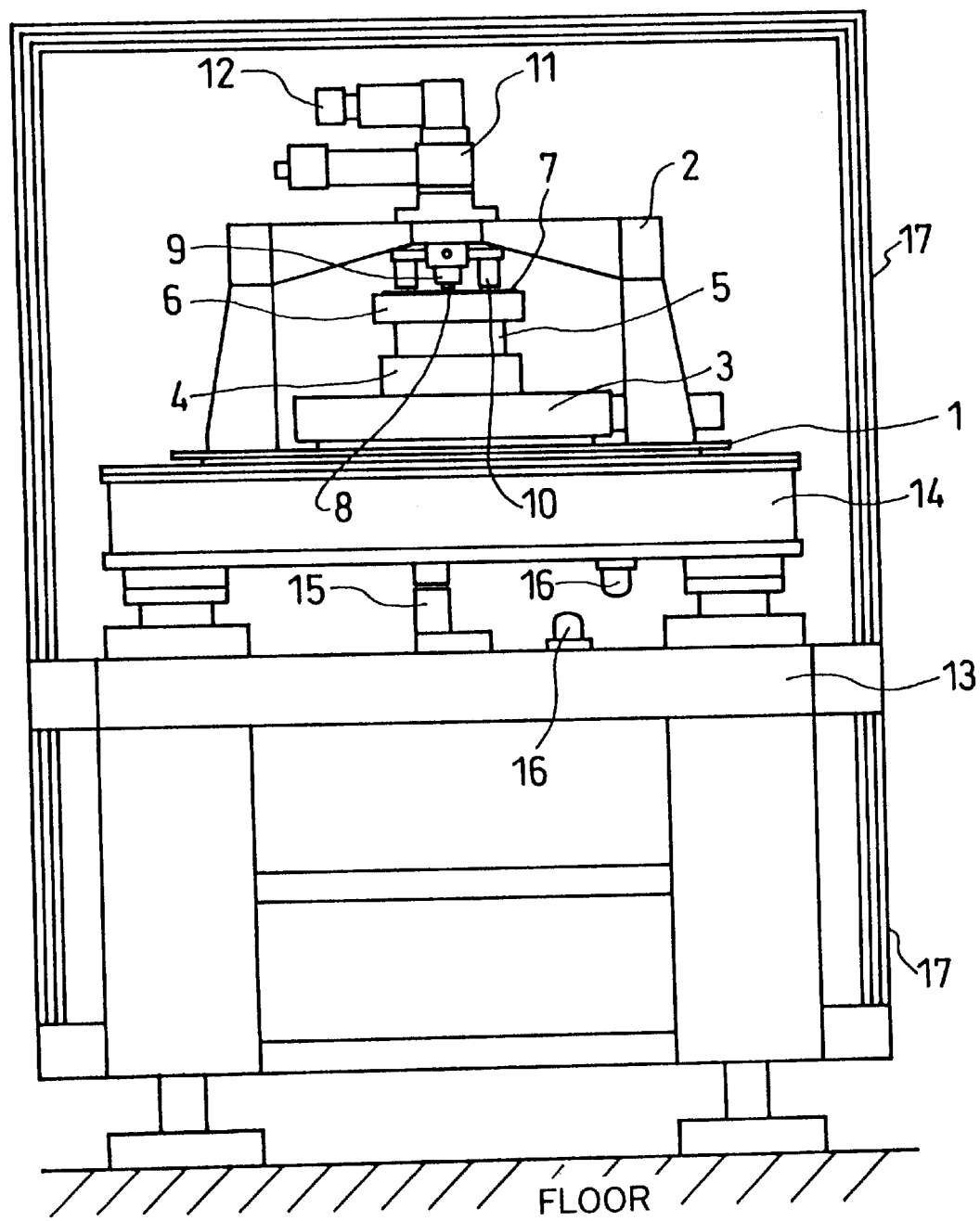
FIG. 1 is a view showing a scanning probe microscope according to an embodiment of the invention.

FIG. 1 is a view showing a structure of an apparatus into which a scanning probe microscope of large size stage is installed. Elemental parts such as a detecting portion of the scanning probe microscope are structured on a base 1. Support arms 2 and an X-axis stage 3 for operation in the right-and-left directions in the drawing, i.e., for X-axis directions, a Y-axis stage 4 for operation in back-and-forth directions in the drawing, i.e., for Y-axis directions and a Z-axis stage 5 for operation in up-and-down directions in the drawing, i.e., for Z-axis directions as three-dimensional stages are fixed on the base 1.

A sample 7 is fixed through a sample holder 6 to the Z-axis stage 5. The sample fixture is carried out by a vacuum chuck in case of wafers. A detecting portion 8 for detecting a surface condition of the sample 7 is positioned in a facing position of the sample 7, and a fine adjusting mechanism 9 is fixed thereto. The fine adjusting mechanism 9 is composed of a piezoelectric element that is deformed upon the application of a voltage and is used for moving the detecting portion 8 in three dimensions relative to the sample 7. In this embodiment, the detecting portion 8 is one having a structure for optically detecting a displacement of a very small spring element that undergoes elastic deformation while receiving a physical force such as a magnetic force or an atomic force received from a surface of the sample 7. It is one structured by making compact a so-called optical lever system in which a laser beam is projected onto the spring element and the deviation of its reflective ray of light is detected by an optical detecting element as the shift signals. The fine adjusting mechanism 9 is fixed to the support arms 2.

Also, an optical microscope 11 having several objective lenses 10 is structured in the Y-direction relative to the fine adjusting mechanism 9. The objective lenses 10 are fixed to an electric power revolver. An image of the optical microscope 11 is formed on a monitor through a CCD camera 12. A positional displacement between the detecting portion 8 and the sample position as viewed through the optical microscope 11 is calculated in advance by using the same reference sample. It is recorded in the system. Then, the displacement may be detected by using the detecting portion 8 in the same position as that as viewed through the optical microscope 11 by using the three-dimensional stages 3, 4 and 5. It should be noted that there is a description about this positioning system in Japanese Patent Application Laid-open No. Hei 3-40356.

Then, all of the above-described elemental parts 1 to 12 are mounted on a base plate or table plate 14 of an anti-vibration table 13. In this embodiment, the anti-vibration table of active control may be of the type manufactured by an anti-vibration table maker (such as the β-series of Patent Instrument Co., Ltd.). A shift meter 15 is provided in each of the axial directions X and Y (horizontal) and Z (vertical) and rotational directions (rolling, yawing and pitching) as displacement detecting means of the anti-vibration table plate 14 relative to the displacement between the anti-vibration table plate 14 and the anti-vibration table 13 or an external turbulence caused by a floor vibration such as an acceleration of the anti-vibration table plate 14. An acceleration pickup (acceleration sensor) 16 is provided as a means for detecting a change rate in addition to the shift meter 15. A vibromotive force having an opposite phase to that of the change rate detected by the shift meter 15 and the acceleration sensor 16 is imparted to the anti-vibration table plate 14.

Also, it is possible to dispense with the vibration control for the opposite phase in the rotational directions as an embodiment of a simplified system. For this reason, the structure of the anti-vibration table plate 14 in which a control for offsetting the displacement relative to the displacement caused by the external vibration will work is taken. In the anti-vibration table 13 used in this embodiment, a pneumatically-operated mechanism for effecting the displacement control through pneumatic pressure is used in the vertical direction (Z) and the rotational directions, and a mechanism (voice coil motor) for controlling the displacement to be offset through a magnetic force is used in the control of the intersurface or horizontal directions (X, Y).

Also, in this embodiment, the scanning probe microscope elements formed on the anti-vibration table 13 and anti-vibration table plate 14 are covered by a noise reduction cover 17 which has a structure for reducing the acoustic vibration having a high frequency. In view of the acoustic mass effect and the metal plate, the noise reduction cover 17 is manufactured and formed of a laminate structure of a noise shielding material made of cured resin with metal powder and noise absorptive material in which metal powder is mixed in foamed material.

Figure 2:
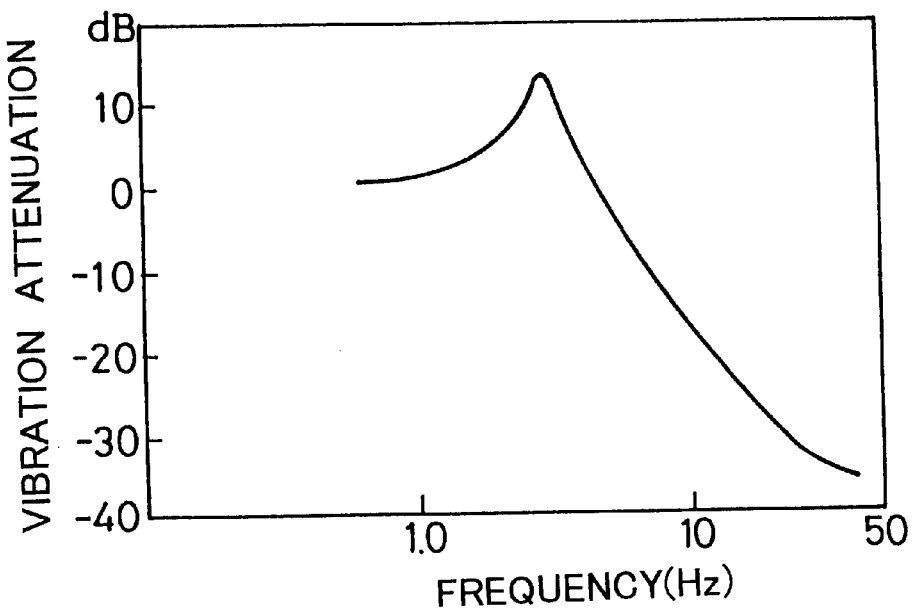
FIG. 2 is a graph showing vibration attenuation characteristics of an air spring type vibration removing mechanism.
Figure 3:
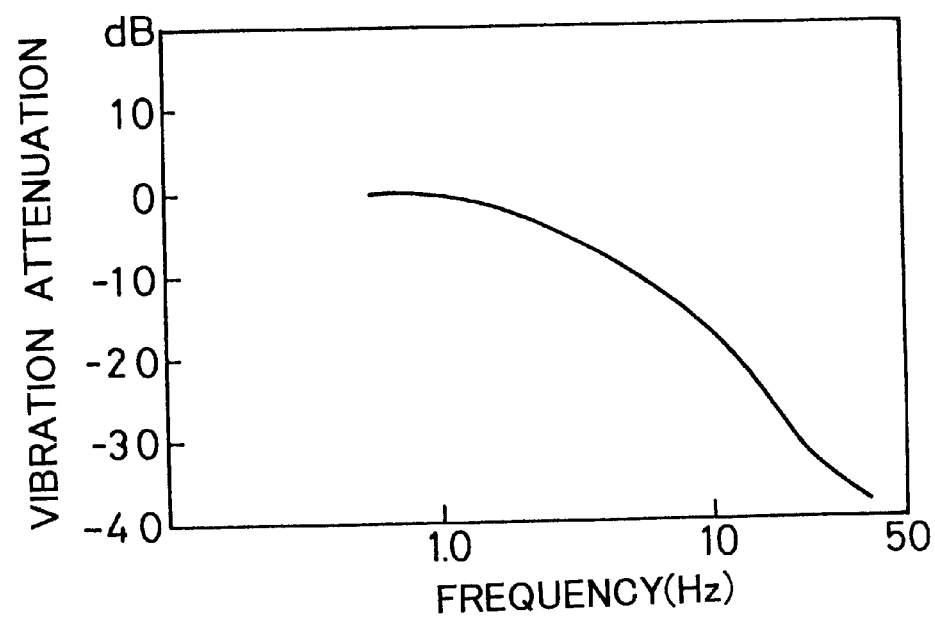
FIG. 3 is a graph showing vibration attenuation characteristics of an anti-vibration table used in the embodiment of the invention.

With such a structure, even if the apparatus is installed in a clean room that receives a wide range of noise vibrations, from a high frequency component to a low frequency component, there is no fear of the vibration attenuation characteristics of the conventional anti-vibration table having the resonance frequency of the air spring as viewed in the spring system or the like as shown in FIG. 2, but the vibration removing mechanism that is excellent in vibration attenuation characteristics in the low frequency region as shown in FIG. 3 is used for the internal structure of the scanning probe microscope, thereby being capable of reducing the noise caused by the low frequency vibration from floor vibration. It is therefore possible to effect the observation while keeping a high resolution that is inherently possessed by the scanning probe microscope. Also, it is possible to remove the high frequency component by the noise reduction cover.

Incidentally, the present invention has been described with respect to certain types of scanning probe microscope. However, the present invention is available in noise reduction effect in the same way in case of the application to a scanning electronic microscope, a transmissive electronic microscope, a focused ion beam apparatus or any other analyzers or manufacturing machines.

What is claimed is:

1. A scanning probe microscope with a stage for observing and evaluating a shape, a condition or a property of a sample surface, comprising: a rough stage for rough positioning and a fine motion mechanism for fine positioning for relatively moving in three dimensions a sample and a detecting portion for detecting a physical quantity received from the sample, control means for keeping constant a distance between the sample and the detecting portion, an anti-vibration table for reducing a low frequency vibration transmission caused by installation circumstances, a controlling electric portion for controlling the detecting portion for detecting the physical quantity, a computer for control, means for detecting a vibration of an anti-vibration table plate disposed on the anti-vibration table, means for adding a vibration having an opposite phase to that of the anti-vibration table plate to the anti-vibration table plate thereby forcibly reducing the vibration thereof, and a noise reduction cover covering the anti-vibration table and the structures supported thereon for reducing the influence of a high frequency acoustic vibration on the scanning probe microscope.

2. A scanning probe microscope as claimed in claim 1, wherein the detecting portion for detecting the physical quantity is disposed on the fine motion mechanism.

3. A scanning probe microscope as claimed in claim 1, wherein the means for adding a vibration to the anti-vibration table plate comprises an air pressure mechanism for controllably displacing the anti-vibration table.

4. A scanning probe microscope as claimed in claim 1, wherein the means for adding a vibration to the anti-vibration table plate comprises a mechanism for producing a magnetic force for controllably displacing the anti-vibration table.

5. A scanning probe microscope as claimed in claim 1, wherein the means for adding a vibration to the anti-vibration table plate comprises a piezoelectric element responsive to a voltage applied thereto for controllably displacing the anti-vibration table.

6. A scanning probe microscope as claimed in claim 1, wherein the means for adding a vibration to the anti-vibration table plate comprises an air pressure mechanism for controllably displacing the anti-vibration table plate in a vertical direction and a rotational direction, and a mechanism for producing a magnetic force for controllably displacing the anti-vibration table in an intersurface direction and a rotational direction.

7. A scanning probe microscope as claimed in claim 1, wherein the means for detecting comprises a static electric capacitance type shift meter.

8. A scanning probe microscope as claimed in claim 1, wherein the means for detecting comprises an electromagnetic detection type shift meter.

9. A scanning probe microscope as claimed in claim 1, wherein the means for detecting comprises an optical detection type shift meter.

10. A scanning probe microscope as claimed in claim 1, wherein the means for detecting comprises a servo type acceleration sensor.

11. A scanning probe microscope as claimed in claim 1, wherein the means for detecting comprises a piezoelectric type acceleration sensor.

12. A scanning probe microscope as claimed in claim 1, wherein the noise reduction cover is comprised of a laminate of noise shielding material and noise absorptive material.

13. A scanning probe microscope as claimed in claim 12, wherein the noise shielding material comprises cured resin with metal powder.

14. A scanning probe microscope as claimed in claim 12, wherein the noise absorptive material comprises metal powder mixed in foamed material.

15. A scanning probe microscope for measuring a physical property of a sample, comprising: a three-dimensionally displaceable table plate supporting thereon a detecting portion for detecting a physical property of the sample, and rough and fine positioning mechanisms for three-dimensionally positioning and scanning the detecting portion relative to the sample; a displaceable anti-vibration table supporting thereon the table plate, the table plate being three-dimensionally displaceable relative to the anti-vibration table; detecting means for detecting vibration of the table plate caused by relatively low frequency vibration of a floor which supports the scanning probe micropscope; means for applying to the table plate a vibration having a phase opposite that of the vibration detected by the detecting means to thereby forcibly reduce relatively low frequency vibration of the table plate caused by the floor vibration; and a noise reduction cover covering the table plate and the anti-vibration table for reducing the influence of relatively high frequency acoustic vibration on the scanning probe microscope.

16. A scanning probe microscope according to claim 15; wherein the means for applying a vibration to the table plate includes a mechanism for applying vibration to the table plate in the vertical direction.

17. A scanning probe microscope according to claim 16; wherein the mechanism for applying vibration to the table plate comprises a pneumatically-operated mechanism.

18. A scanning probe microscope according to claim 16; wherein the means for applying a vibration to the table plate includes mechanisms for applying vibration to the table plate in rotational directions about a z-axis extending in the vertical direction and about x- and y-axes extending in horizontal directions.

19. A scanning probe microscope according to claim 18; wherein the mechanisms for applying vibration to the table plate in rotational directions comprise pneumatically-operated mechanisms.

20. A scanning probe microscope according to claim 18; wherein the means for applying a vibration to the table plate includes mechanisms for applying vibration to the table plate in orthogonal horizontal directions.

21. A scanning probe microscope according to claim 20; wherein the mechanisms for applying vibration to the table plate in orthogonal horizontal directions comprise mechanisms for magnetically vibrating the table plate.

22. A scanning probe microscope according to claim 16; wherein the means for applying a vibration to the table plate includes mechanisms for applying vibration to the table plate in orthogonal horizontal directions.

23. A scanning probe microscope according to claim 22; wherein the mechanism for applying a vibration to the table plate in the vertical direction comprises a pneumatically-operated mechanism, and the mechanisms for applying vibration to the table plate in orthogonal horizontal directions comprise mechanisms for magnetically vibrating the table plate.

24. A scanning probe microscope according to claim 22; wherein the detecting means comprises means for detecting vibration of the table plate relative to the anti-vibration table in the vertical and orthogonal horizontal directions.

25. A scanning probe microscope according to claim 24; wherein the means for detecting includes a shift meter.

26. A scanning probe microscope according to claim 24; wherein the means for detecting includes a static electric capacitance detector.

27. A scanning probe microscope according to claim 24; wherein the means for detecting includes an electromagnetic detector.

28. A scanning probe microscope according to claim 24; wherein the means for detecting includes an optical detector.

29. A scanning probe microscope according to claim 24; wherein the means for detecting includes a piezoelectric acceleration sensor.

30. A scanning probe microscope according to claim 24; wherein the means for detecting includes a servo acceleration sensor.

31. A scanning probe microscope according to claim 16; including an optical microscope supported on the table plate for viewing the sample.

32. A scanning probe microscope according to claim 31; including a camera supported on the table plate for forming an image of the sample viewed by the optical microscope.

33. A scanning probe microscope according to claim 15; wherein the noise reduction cover is comprised of a laminate of acoustic energy shielding material and acoustic energy absorptive material.

34. A scanning probe microscope according to claim 33; wherein the acoustic energy shielding material comprises resin containing metal powder.

35. A scanning probe microscope as claimed in claim 33, wherein the acoustic energy absorptive material comprises a foamed material containing metal powder.

* * * * *